United States Patent
Guillorn et al.

(10) Patent No.: US 10,580,858 B2
(45) Date of Patent: *Mar. 3, 2020

(54) PREVENTING THRESHOLD VOLTAGE VARIABILITY IN STACKED NANOSHEETS

(71) Applicant: International Business Machines Corporation, Armonk, NY (US)

(72) Inventors: Michael A. Guillorn, Cold Spring, NY (US); Nicolas J. Loubet, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/103,070

(22) Filed: Aug. 14, 2018

(65) Prior Publication Data

US 2019/0006462 A1 Jan. 3, 2019

Related U.S. Application Data

(63) Continuation of application No. 15/342,346, filed on Nov. 3, 2016, now Pat. No. 10,177,226.

(51) Int. Cl.
| | |
|---|---|
| *H01L 29/06* | (2006.01) |
| *H01L 29/786* | (2006.01) |
| *H01L 29/66* | (2006.01) |
| *H01L 29/423* | (2006.01) |
| *H01L 29/775* | (2006.01) |
| *B82Y 10/00* | (2011.01) |
| *H01L 21/308* | (2006.01) |
| *H01L 29/10* | (2006.01) |
| *H01L 21/28* | (2006.01) |

(Continued)

(52) U.S. Cl.
CPC .... *H01L 29/0665* (2013.01); *H01L 21/28017* (2013.01); *H01L 21/3081* (2013.01); *H01L 21/823807* (2013.01); *H01L 27/092* (2013.01); *H01L 29/1033* (2013.01); *H01L 29/42372* (2013.01); *H01L 29/66742* (2013.01); *H01L 29/786* (2013.01)

(58) Field of Classification Search
None
See application file for complete search history.

(56) References Cited

U.S. PATENT DOCUMENTS

| | | |
|---|---|---|
| 6,087,269 A | 7/2000 | Williams |
| 7,682,891 B2 | 3/2010 | Lavoie et al. |

(Continued)

OTHER PUBLICATIONS

IBM "List of IBM Patents or Patent Applications Treated As Related; (Appendix P)", filed Aug. 21, 2018, 2 pages.

*Primary Examiner* — Herve-Louis Y Assouman
(74) *Attorney, Agent, or Firm* — Cantor Colburn LLP; Vazken Alexanian

(57) ABSTRACT

Embodiments are directed to a method of forming a stacked nanosheet and resulting structures having equal thickness work function metal layers. A nanosheet stack is formed on a substrate. The nanosheet stack includes a first sacrificial layer formed on a first nanosheet. A hard mask is formed on the first sacrificial layer and the first sacrificial layer is removed to form a cavity between the hard mask and the first nanosheet. A work function layer is formed to fill the cavity between the hard mask and the first nanosheet.

20 Claims, 14 Drawing Sheets

(51) Int. Cl.
*H01L 27/092* (2006.01)
*H01L 21/8238* (2006.01)

(56) References Cited

U.S. PATENT DOCUMENTS

| | | | |
|---|---|---|---|
| 7,893,492 B2 | 2/2011 | Bedell et al. | |
| 8,084,308 B2 | 12/2011 | Chang et al. | |
| 8,658,518 B1 | 2/2014 | Chang et al. | |
| 8,952,355 B2 | 2/2015 | Romero et al. | |
| 9,257,545 B2 | 2/2016 | Leobandung | |
| 9,318,552 B2 | 4/2016 | Xie et al. | |
| 9,362,177 B1 | 6/2016 | Haensch et al. | |
| 10,074,730 B2 | 9/2018 | Bergendahl et al. | |
| 10,177,226 B2 * | 1/2019 | Guillorn | H01L 29/0665 |
| 2002/0005542 A1 | 1/2002 | Hayano et al. | |
| 2004/0137703 A1 | 7/2004 | Gao et al. | |
| 2006/0216897 A1 | 9/2006 | Lee et al. | |
| 2008/0099849 A1 | 5/2008 | Kim et al. | |
| 2010/0167504 A1 | 7/2010 | Anderson et al. | |
| 2011/0003451 A1 | 1/2011 | Orlowski et al. | |
| 2013/0037865 A1 | 2/2013 | Nogami et al. | |
| 2013/0270512 A1 | 10/2013 | Radosavljevic et al. | |
| 2014/0001441 A1 | 1/2014 | Kim et al. | |
| 2014/0264276 A1 | 9/2014 | Chang et al. | |
| 2015/0228480 A1 | 8/2015 | Yin et al. | |
| 2015/0287649 A1 * | 10/2015 | Ando | H01L 21/28088 257/369 |
| 2015/0295084 A1 | 10/2015 | Obradovic et al. | |
| 2018/0122899 A1 | 5/2018 | Guillorn et al. | |

* cited by examiner

PREVENTING THRESHOLD VOLTAGE VARIABILITY IN STACKED NANOSHEETS

DOMESTIC PRIORITY

This application is a continuation of U.S. patent application Ser. No. 15/342,346, filed Nov. 3, 2016, the disclosure of which is incorporated by reference herein in its entirety.

BACKGROUND

The present invention relates in general to semiconductor device fabrication methods and resulting structures. More specifically, the present invention relates to fabrication methods and resulting structures for preventing threshold voltage (Vt) variability in a stacked nanosheet structure.

In contemporary semiconductor device fabrication processes a large number of semiconductor devices, such as field effect transistors (FETs), are fabricated on a single wafer. Some non-planar device architectures, such as nanosheet FETs, provide increased device density and some increased performance over lateral devices. In nanosheet FETs, in contrast to conventional FETs, the gate stack wraps around the full perimeter of each nanosheet, enabling fuller depletion in the channel region, and reducing short-channel effects due to steeper subthreshold swing (SS) and smaller drain induced barrier lowering (DIBL). The wrap-around gate structures and source/drain contacts used in nanosheet devices also enable greater management of leakage current and parasitic capacitance in the active regions, even as drive currents increase.

SUMMARY

According to one or more embodiments of the present invention, a method of fabricating a stacked nanosheet having equal thickness work function metal layers is provided. The method can include forming a nanosheet stack on a substrate. The nanosheet stack includes a first sacrificial layer formed on a first nanosheet. The method can include forming a hard mask on the first sacrificial layer and removing the first sacrificial layer to form a cavity between the hard mask and the first nanosheet. The method can include forming a work function layer to fill the cavity between the hard mask and the first nanosheet.

According to one or more embodiments of the present invention, a method of fabricating a stacked nanosheet having equal thickness work function metal layers is provided. The method can include forming a first sacrificial layer on a substrate. A first nanosheet is formed on the first sacrificial layer and a second sacrificial layer is formed on the first nanosheet. The method can include forming a hard mask on the second sacrificial layer and removing the first and second sacrificial layers to form a first cavity between the first nanosheet and the substrate and a second cavity between the hard mask and the first nanosheet. The method can include forming a first work function layer to fill the first cavity and a second work function layer to fill the second cavity. A thickness of the first work function layer is equal to a thickness of the second work function layer.

According to one or more embodiments of the present invention, a stacked nanosheet structure having equal thickness work function metal layers is provided. The structure can include a nanosheet stack formed over a substrate. The nanosheet stack includes a first nanosheet vertically stacked between a top work function layer and a bottom work function layer. The structure can include a gate formed over a channel region of the nanosheet stack and a conductive layer formed between the gate and the top work function layer. A thickness of the top work function layer is equal to a thickness of the bottom work function layer.

BRIEF DESCRIPTION OF THE DRAWINGS

The subject matter of the present invention is particularly pointed out and distinctly defined in the claims at the conclusion of the specification. The foregoing and other features and advantages are apparent from the following detailed description taken in conjunction with the accompanying drawings in which:

FIG. 1 depicts a cross-sectional view of a structure along a direction X-X' having nanosheets formed on a substrate during an intermediate operation of a method of fabricating a semiconductor device according to one or more embodiments of the present invention;

FIG. 2 depicts a cross-sectional view of the structure along the direction X-X' after forming a hard mask over a portion of a sacrificial layer within an nFET region of the substrate during an intermediate operation of a method of fabricating a semiconductor device according to one or more embodiments of the present invention;

FIG. 3 depicts a cross-sectional view of the structure along the direction X-X' after forming nanosheets on the substrate within a pFET region during an intermediate operation of a method of fabricating a semiconductor device according to one or more embodiments of the present invention;

FIG. 4 depicts a cross-sectional view of the structure along the direction X-X' after patterning the nanosheets to expose portions of the substrate during an intermediate operation of a method of fabricating a semiconductor device according to one or more embodiments of the present invention;

FIG. 5 depicts a cross-sectional view of the structure along the direction X-X' after forming a shallow trench isolation (STI) on the exposed portions of the substrate during an intermediate operation of a method of fabricating a semiconductor device according to one or more embodiments of the present invention;

FIG. 6 depicts a cross-sectional view of the structure along the direction X-X' after forming a first sacrificial gate over a channel region of the first nanosheet stack during an intermediate operation of a method of fabricating a semiconductor device according to one or more embodiments of the present invention;

FIG. 7 depicts a cross-sectional view of the structure along a direction Y-Y' after forming the first and second sacrificial gates during an intermediate operation of a method of fabricating a semiconductor device according to one or more embodiments of the present invention;

FIG. 8 depicts a cross-sectional view of the structure along the direction Y-Y' after forming spacers on surfaces of the first and second sacrificial gates during an intermediate operation of a method of fabricating a semiconductor device according to one or more embodiments of the present invention;

FIG. 9 depicts a cross-sectional view of the structure along the direction Y-Y' after forming doped regions during an intermediate operation of a method of fabricating a semiconductor device according to one or more embodiments of the present invention;

FIG. 10 depicts a cross-sectional view of the structure along the direction Y-Y' after opening the hard masks to expose a surface of the first and second sacrificial gates during an intermediate operation of a method of fabricating a semiconductor device according to one or more embodiments of the present invention;

Figure 13:
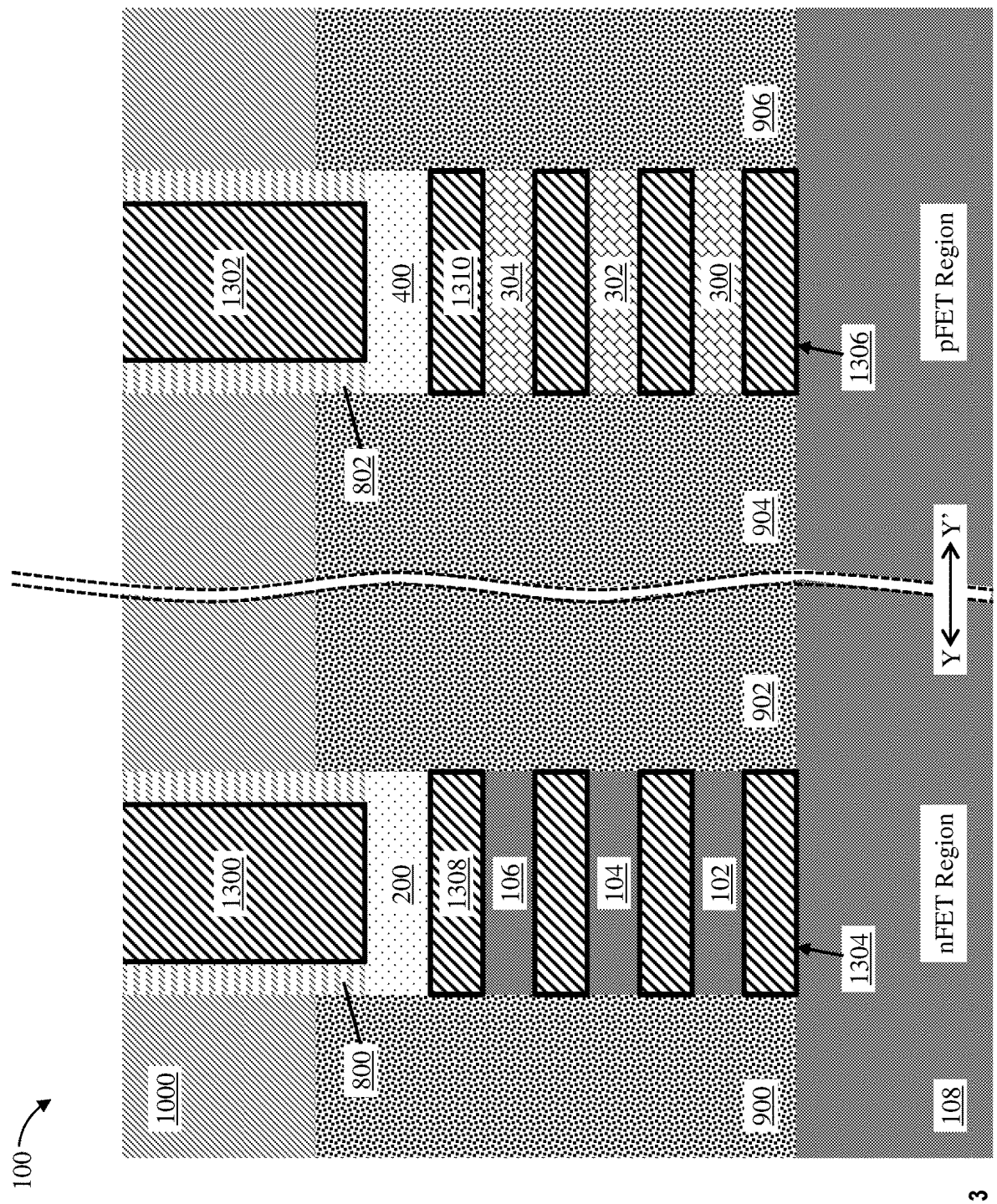
Figure 14:
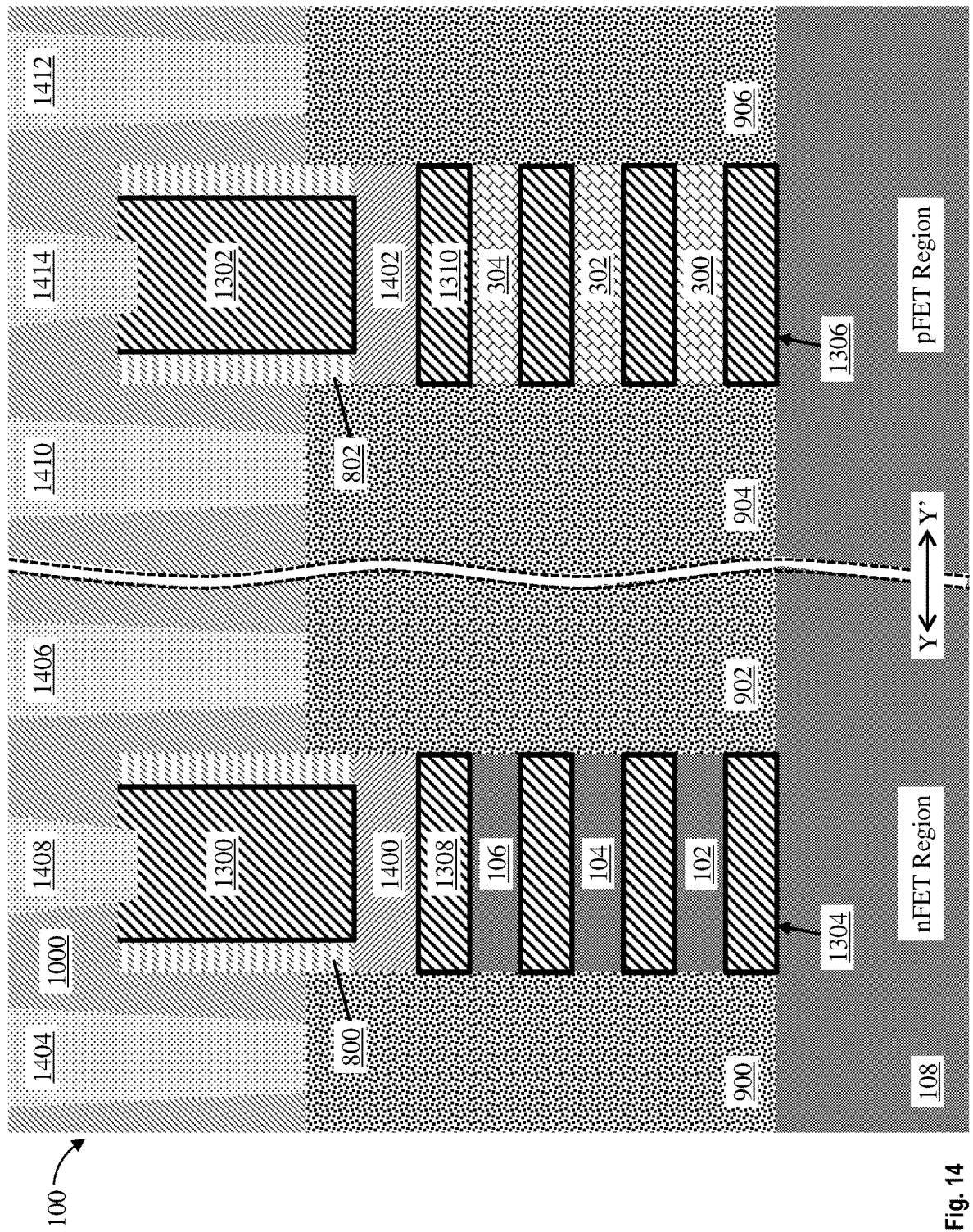

FIG. 13 depicts a cross-sectional view of the structure along the direction Y-Y' after forming conductive gates to wrap around channel portions of the first and second nanosheet stacks during an intermediate operation of a method of fabricating a semiconductor device according to one or more embodiments of the present invention; and FIG. 14 depicts a cross-sectional view of the structure along the direction Y-Y' after replacing the hard masks with conductive layers during an intermediate operation of a method of fabricating a semiconductor device according to one or more embodiments of the present invention.

DETAILED DESCRIPTION

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. The term "selective to," such as, for example, "a first element selective to a second element," means that a first element can be etched and the second element can act as an etch stop. The term "conformal" (e.g., a conformal layer) means that the thickness of the layer is substantially the same on all surfaces, or that the thickness variation is less than 15% of the nominal thickness of the layer.

As used herein, the terms "about," "substantially," "approximately," and variations thereof are intended to include the degree of error associated with measurement of the particular quantity based upon the equipment available at the time of filing the application. For example, "about" can include a range of ±8% or 5%, or 2% of a given value.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), plasma-enhanced chemical vapor deposition (PECVD), electrochemical deposition (ECD), molecular beam epitaxy (MBE), and more recently, atomic layer deposition (ALD) and plasma-enhanced atomic layer deposition (PEALD), among others.

Removal/etching is any process that removes material from the wafer. Examples include etch processes (either wet or dry), and chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is generated under low pressure (vacuum) by an electromagnetic field.

Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to a description of technologies that are more specifically relevant to the present invention, as previously noted herein, non-planar device architectures, such as nanosheet FET devices, result in increased device density over lateral devices. There are challenges, however, in providing non-planar architectures for scaling beyond the 10 nm node. For example, stacked nanosheet architectures are vulnerable to threshold voltage variations. Conventional stacked nanosheet architectures rely on work function metals formed between adjacent nanosheets to improve device performance. As threshold voltage changes as a function of the thickness of a work function metal, the work function metal layers formed between adjacent nanosheets should have the same thickness. Conventional stacked nanosheet fabrication processes form work function metal layers having slight variations in thickness, causing threshold voltage variations within a nanosheet FET. Thus, a method is desired for preventing threshold voltage variability in a stacked nanosheet.

Turning now to an overview of the aspects of the present invention, one or more embodiments provide methods of fabricating a nanosheet stack having equal thickness work function metal layers. A hard mask is formed on a topmost sacrificial layer of a nanosheet stack. The hard mask is not removed until work function layers are deposited in the nanosheet stack to replace the sacrificial layers. In this manner, the thickness of each work function layer in a direction perpendicular to a major surface of the nanosheet stack is substantially equal. In particular, the hard mask ensures that the thickness of the topmost work function layer will be the same as the thickness of the other work function layers. Consequently, the nanosheet stack is not subject to threshold voltage variations caused by differences in work function layer thicknesses.

Example methods for fabricating a stacked nanosheet having equal thickness work function metal layers and the resulting structures therefrom in accordance with embodiments of the present invention are described in detail below by referring to the accompanying drawings in FIGS. 1-14.

Figure 1:
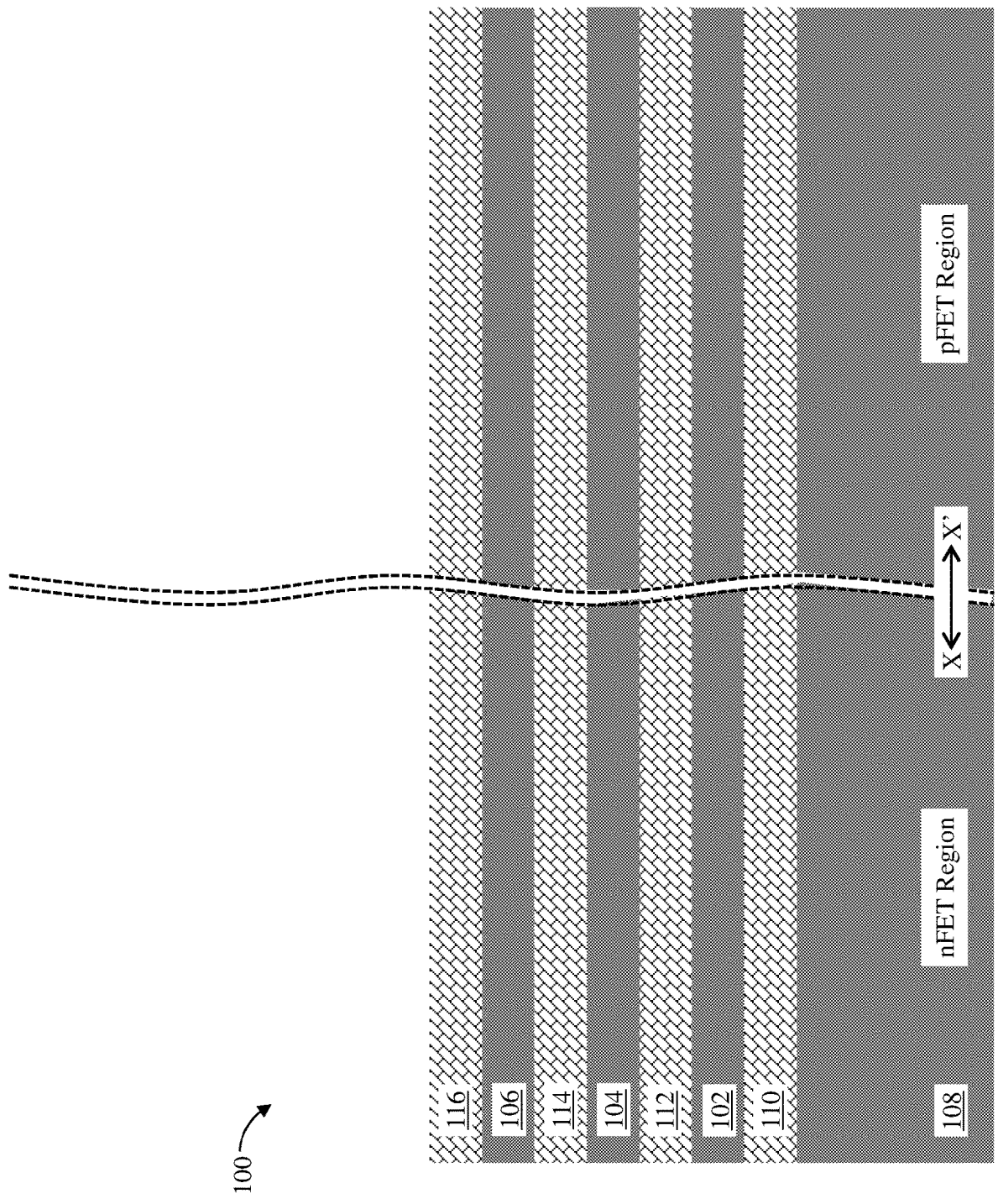

FIG. 1 illustrates a cross-sectional view of a structure 100 along a direction X-X' (across nanosheets direction) having nanosheets 102, 104, and 106 (collectively referred to as a nanosheet stack) formed on a substrate 108 during an intermediate operation of a method of fabricating a semiconductor device according to one or more embodiments. In some embodiments, the nanosheets 102, 104, and 106 are vertically-stacked nanosheets. In some embodiments, the nanosheets 102, 104, and 106 alternate with sacrificial layers 110, 112, 114, and 116. For ease of discussion reference is made to operations performed on and to a nanosheet stack having three nanosheets (e.g., nanosheets 102, 104, and 106) alternating with four sacrificial layers (e.g., sacrificial layers 110, 112, 114, and 116). It is understood, however, that the nanosheet stack can include any number of nanosheets alternating with a corresponding number of sacrificial layers. For example, the nanosheet stack can include a single nanosheet, two nanosheets, five nanosheets, eight nanosheets, or any number of nanosheets, along with a corresponding number of sacrificial layers (i.e., as appropriate to form a nanosheet stack having a topmost sacrificial layer on a topmost nanosheet, a bottommost sacrificial layer under a bottommost nanosheet, and a sacrificial layer between each pair of adjacent nanosheets).

The nanosheets 102, 104, and 106 can be any suitable material such as, for example, monocrystalline Si or silicon germanium (SiGe). In some embodiments, the nanosheets 102, 104, and 106 are nFET nanosheets. In some embodiments, the nFET nanosheets are Si nFET nanosheets. In some embodiments, the nanosheets 102, 104, and 106 have a thickness of about 4 nm to about 10 nm, although other thicknesses are within the contemplated scope of the invention. In yet other embodiments, the nanosheets 102, 104, and 106, have a thickness of about 6 nm, although other thicknesses are within the contemplated scope of the invention.

The substrate 108 can be any suitable substrate material, such as, for example, monocrystalline Si, SiGe, SiC, III-V compound semiconductor, II-VI compound semiconductor, or semiconductor-on-insulator (SOI). In some embodiments, the substrate 108 includes a buried oxide layer (not depicted). In some embodiments, the substrate 108 includes both an nFET Region and a pFET Region. In some embodiments, the substrate 108 includes either an nFET Region or a pFET Region. For ease of discussion reference is made to operations performed on and to a substrate having both nFET and pFET Regions.

In some embodiments, the sacrificial layers 110, 112, 114, and 116 can be Si or SiGe. In embodiments where the nanosheets 102, 104, and 106 are Si nFET nanosheets the sacrificial layers 110, 112, 114, and 116 are SiGe. In some embodiments, the sacrificial layers 110, 112, 114, and 116 have a thickness of about 4 nm to about 15 nm, although other thicknesses are within the contemplated scope of the invention. In yet other embodiments, the sacrificial layers 110, 112, 114, and 116 have a thickness of about 10 nm.

Figure 2:
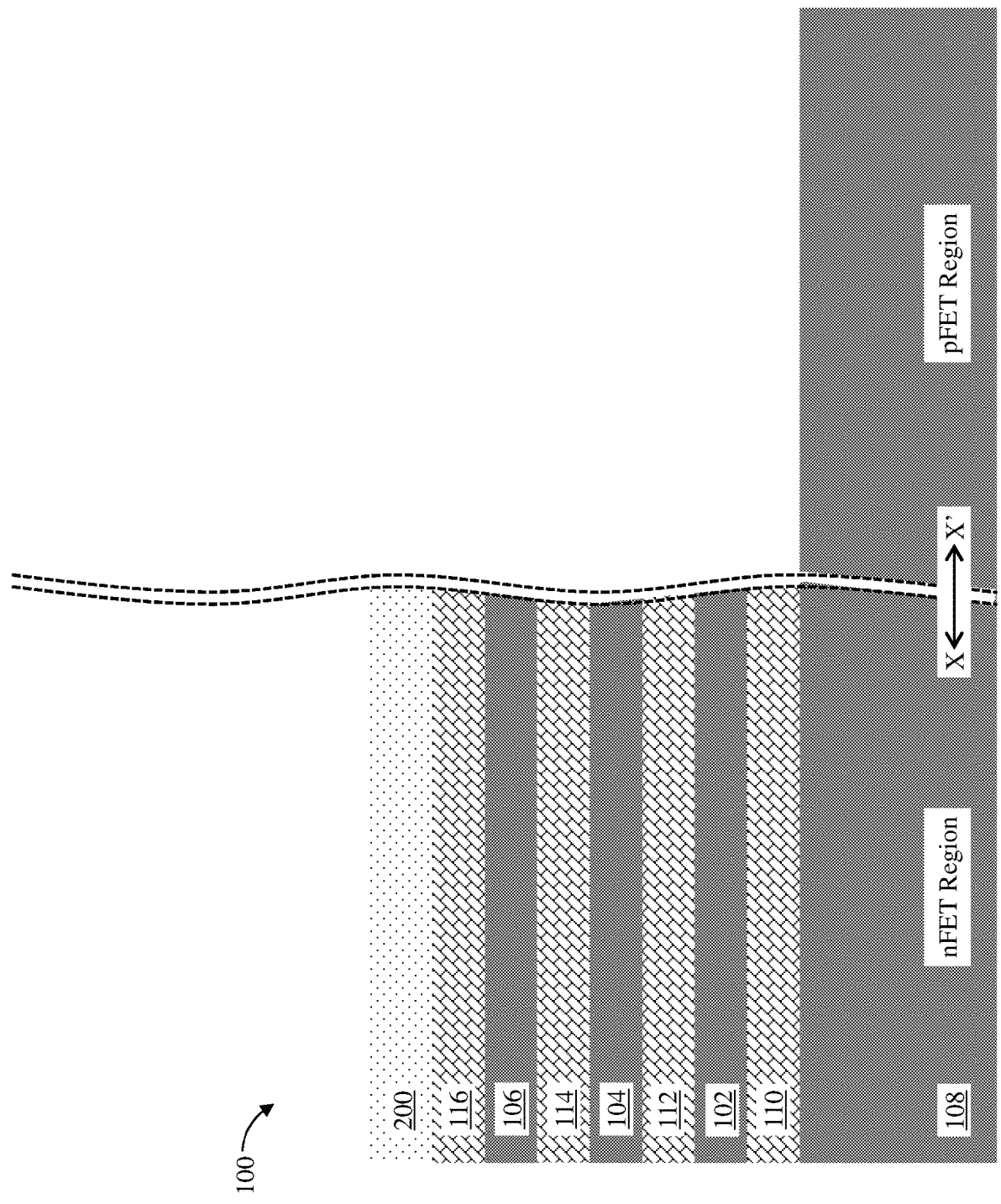

FIG. 2 illustrates a cross-sectional view of the structure 100 along the direction X-X' after forming a hard mask 200 over a portion of the sacrificial layer 116 within the nFET Region of the substrate 108 during an intermediate operation of a method of fabricating a semiconductor device according to one or more embodiments. The hard mask 200 can be of any suitable material, such as, for example, a silicon nitride, silicon dioxide, a silicon oxynitride (SiON), a silicon carbide (SiC), a silicon oxygen carbonitride (SiOCN), or a silico-boron carbonitride (SiBCN). In some embodiments, the hard mask 200 is a silicon nitride. In some embodiments, the hard mask 200 has a thickness of about 10 nm to about 30 nm, although other thicknesses are within the contemplated scope of the invention. In some embodiments, the hard mask 200 has a thickness of about 20 nm. After forming the hard mask 200, uncovered portions of the nanosheets 102, 104, and 106 and sacrificial layers 110, 112, 114, and 116 are removed from a pFET Region of the substrate 108. In some embodiments, the hard mask 200 is formed over the entire sacrificial layer 116 and a patterned photoresist (not depicted) is formed over the portion of the sacrificial layer 116 within the nFET Region. The portions of the nanosheets 102, 104, and 106, sacrificial layers 110, 112, 114, and 116, and hard mask 200 which were not covered by the photoresist are then removed using known lithographic processes, such as, for example, ME.

Figure 3:
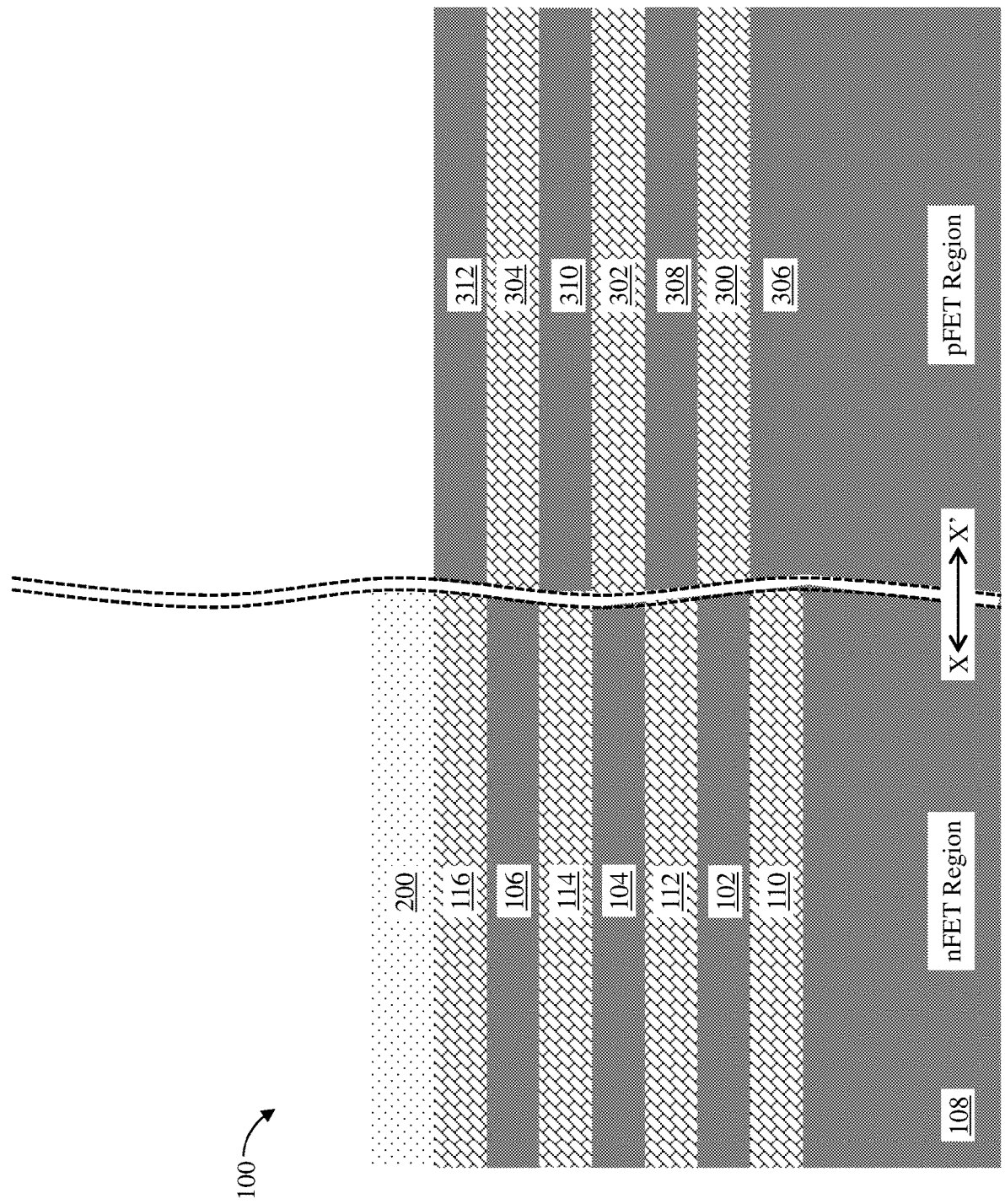

FIG. 3 illustrates a cross-sectional view of the structure 100 along the direction X-X' after forming nanosheets 300, 302, and 304 on the substrate 108 within the pFET Region during an intermediate operation of a method of fabricating a semiconductor device according to one or more embodiments. In some embodiments, the nanosheets 300, 302, and 304 alternate with sacrificial layers 306, 308, 310, and 312. In embodiments having both nFET and pFET regions the nanosheets 102, 104, and 106 are Si nFET nanosheets and the nanosheets 300, 302, and 304 are SiGe pFET nanosheets. In embodiments where the nanosheets 300, 302, and 304 are SiGe pFET nanosheets the sacrificial layers 306, 308, 310, and 312 are Si. In some embodiments, the sacrificial layers 306, 308, 310, and 312 have a thickness of about 4 nm to about 15 nm, although other thicknesses are within the contemplated scope of the invention. In yet other embodiments, the sacrificial layers 306, 308, 310, and 312 have a thickness of about 10 nm.

Figure 4:
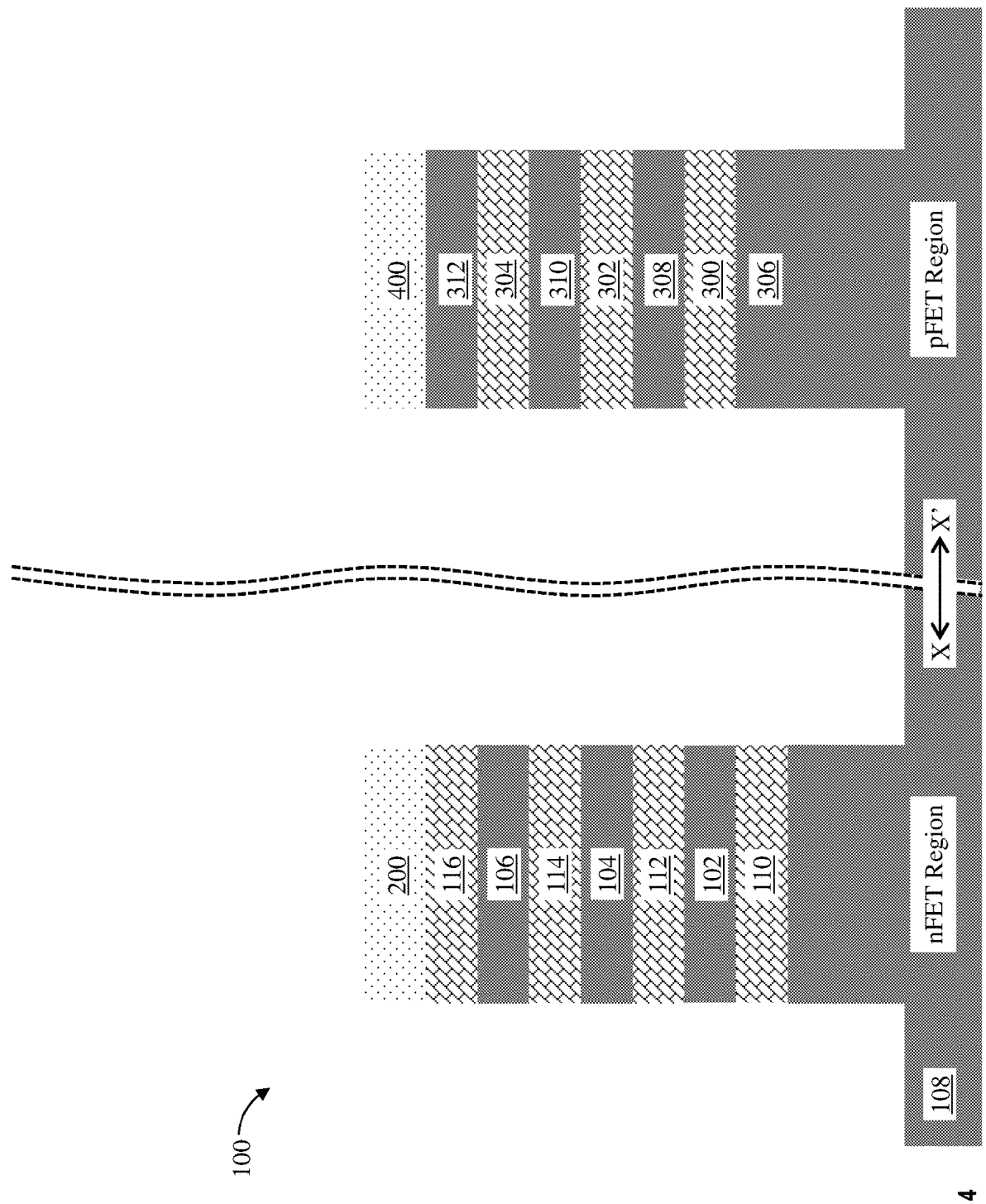

FIG. 4 illustrates a cross-sectional view of the structure 100 along the direction X-X' after patterning the nanosheets 102, 104, 106, 300, 302, and 304 to expose portions of the substrate 108 during an intermediate operation of a method of fabricating a semiconductor device according to one or more embodiments. Prior to this operation a hard mask 400 is formed on a surface of the sacrificial layer 312. The hard mask 400 can be formed in a like manner, composition, and thickness as the hard mask 200. In this manner, the nanosheets 102, 104, and 106 define a first nanosheet stack and the nanosheets 300, 302, and 304 define a second nanosheet stack. Any known manner of patterning can be used, such as, for example, a sidewall image transfer (SIT) operation, a wet etch process, or a dry etch process. In some embodiments, the nanosheets 102, 104, 106, 300, 302, and 304 are patterned using directional ME.

Figure 5:
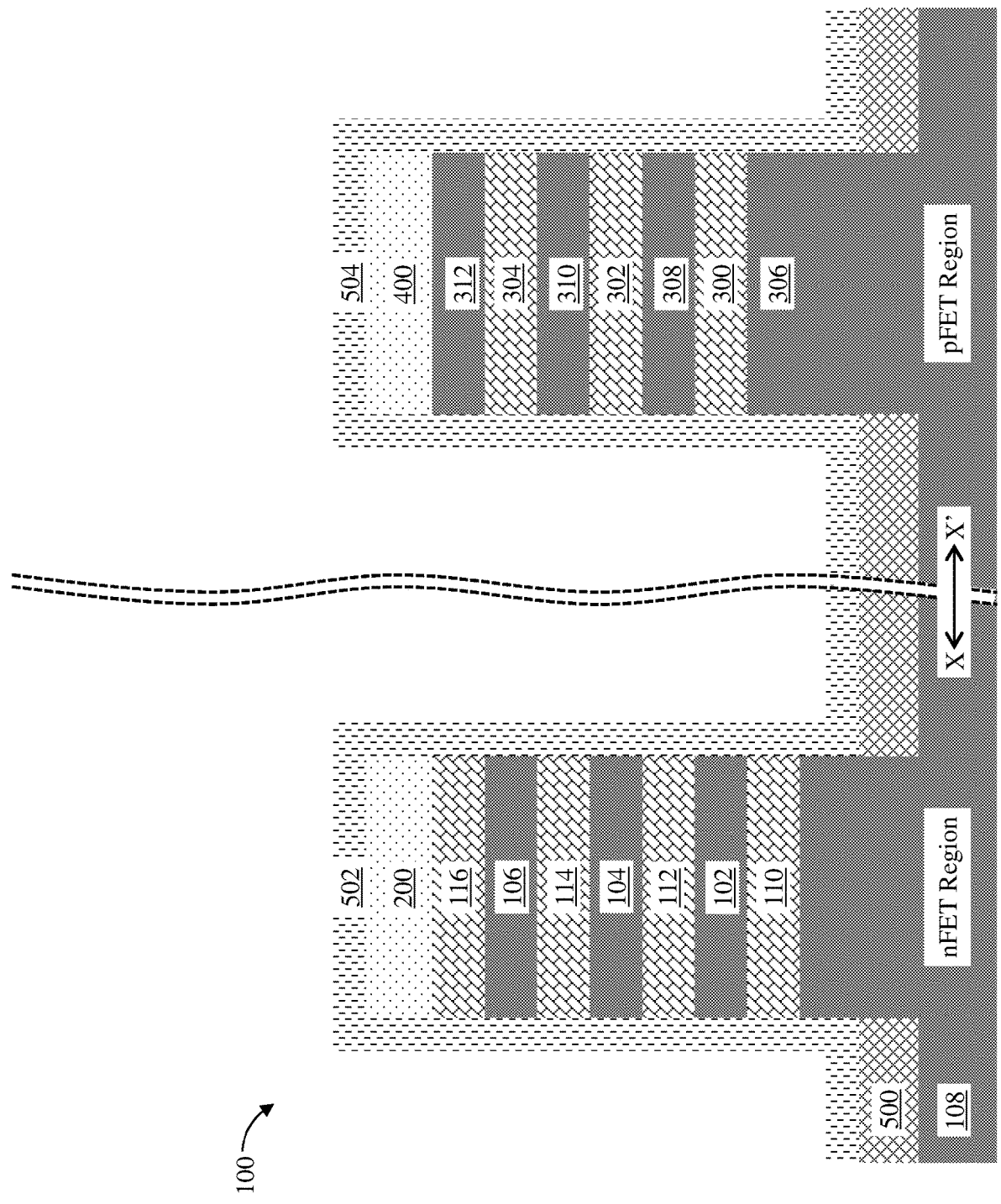

FIG. 5 illustrates a cross-sectional view of the structure 100 along the direction X-X' after forming a shallow trench isolation (STI) 500 on the exposed portions of the substrate 108 during an intermediate operation of a method of fabricating a semiconductor device according to one or more embodiments. The STI 500 prevents electrical current leak between adjacent semiconductor device components. Any known composition and manner of forming the STI 500 can be utilized. The STI 500 can be of any suitable material, such as, for example, a silicon oxide. In some embodiments, the STI 500 is etched via an etch back after a CMP process. In some embodiments, oxide layers 502 and 504 are formed over the nanosheet stacks in the nFET Region and pFET Region, respectively. In some embodiments, the oxide layers 502 and 504 are a single oxide layer conformally formed over the structure 100.

Figure 6:
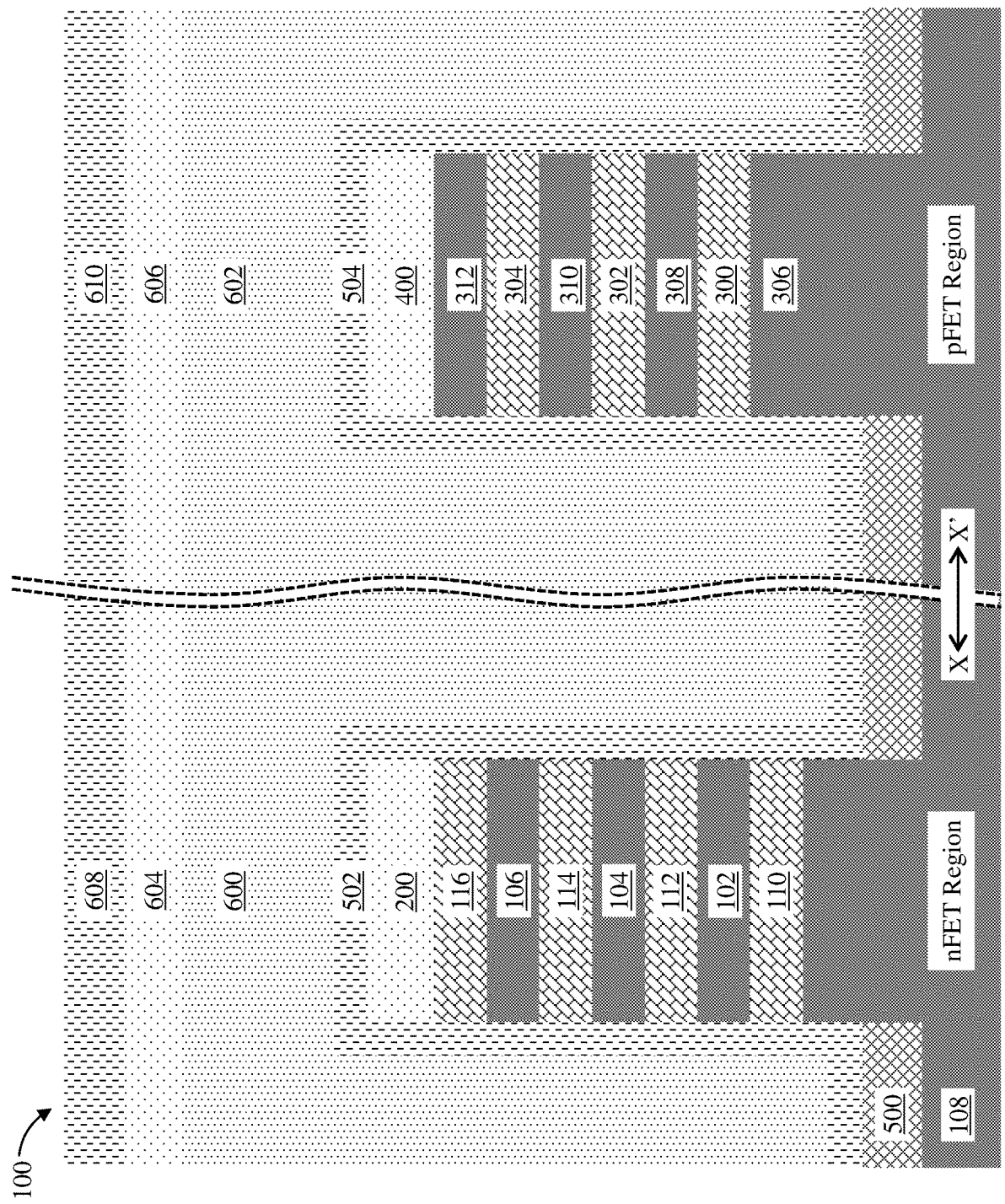

FIG. 6 illustrates a cross-sectional view of the structure 100 along the direction X-X' after forming a first sacrificial gate 600 over a channel region of the first nanosheet stack (i.e., nanosheets 102, 104, and 106) during an intermediate operation of a method of fabricating a semiconductor device according to one or more embodiments. A second sacrificial gate 602 is formed over a channel region of the second nanosheet stack (i.e., nanosheets 300, 302, and 304). The sacrificial gates 600 and 602 can be any suitable material, such as, for example, amorphous silicon or polysilicon. Any known manner of forming the first and second sacrificial gates 600 and 602 can be utilized. In some embodiments, a hard mask 604 is formed on the first sacrificial gate 600 and a hard mask 606 is formed on the second sacrificial gate 602. In some embodiments, the first and second sacrificial gates 600 and 602 are formed by patterning the hard masks 604 and 606 and using a wet or dry etch process to selectively remove portions of the first and second sacrificial gates 600 and 602 which are not covered by the pattered hard masks 604 and 606. The hard masks 604 and 606 can be made of any suitable material, such as, for example, a silicon nitride. In some embodiments, second hard masks 608 and 610 are formed on the hard masks 604 and 606, respectively. The hard mask 604 and the second hard mask 608 form a bilayer hard mask. The hard mask 606 and the second hard mask 610 similarly form a bilayer hard mask. In some embodiments, the second hard masks 608 and 610 are an oxide, such as, for example, silicon dioxide.

Figure 7:
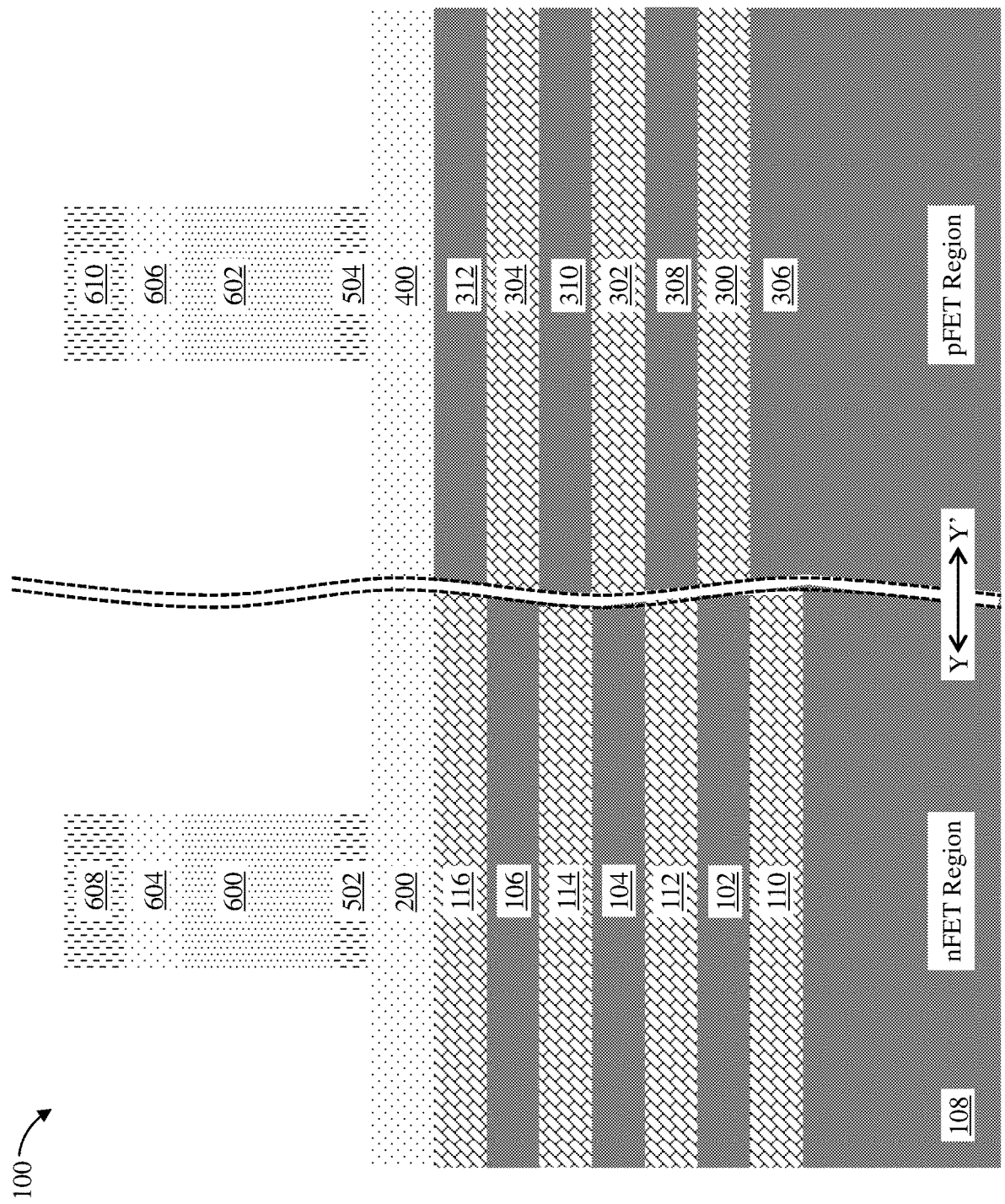

FIG. 7 illustrates a cross-sectional view of the structure 100 along a direction Y-Y' (across gate direction) after forming the first and second sacrificial gates 600 and 602 during an intermediate operation of a method of fabricating a semiconductor device according to one or more embodiments. The direction Y-Y' is perpendicular to the direction X-X'. Portions of the first sacrificial gate 600, portions of the hard masks 604 and 608, and portions of the oxide layer 502 are removed to expose a surface of the hard mask 200. In a similar manner, portions of the second sacrificial gate 602, portions of the hard masks 606 and 610, and portions of the oxide layer 504 are removed to expose a surface of the hard mask 400. Any known method for patterning a sacrificial gate (also known as a dummy gate) can be used, such as, for example, a wet etch, a dry etch, or a combination of sequential wet and/or dry etches.

Figure 8:
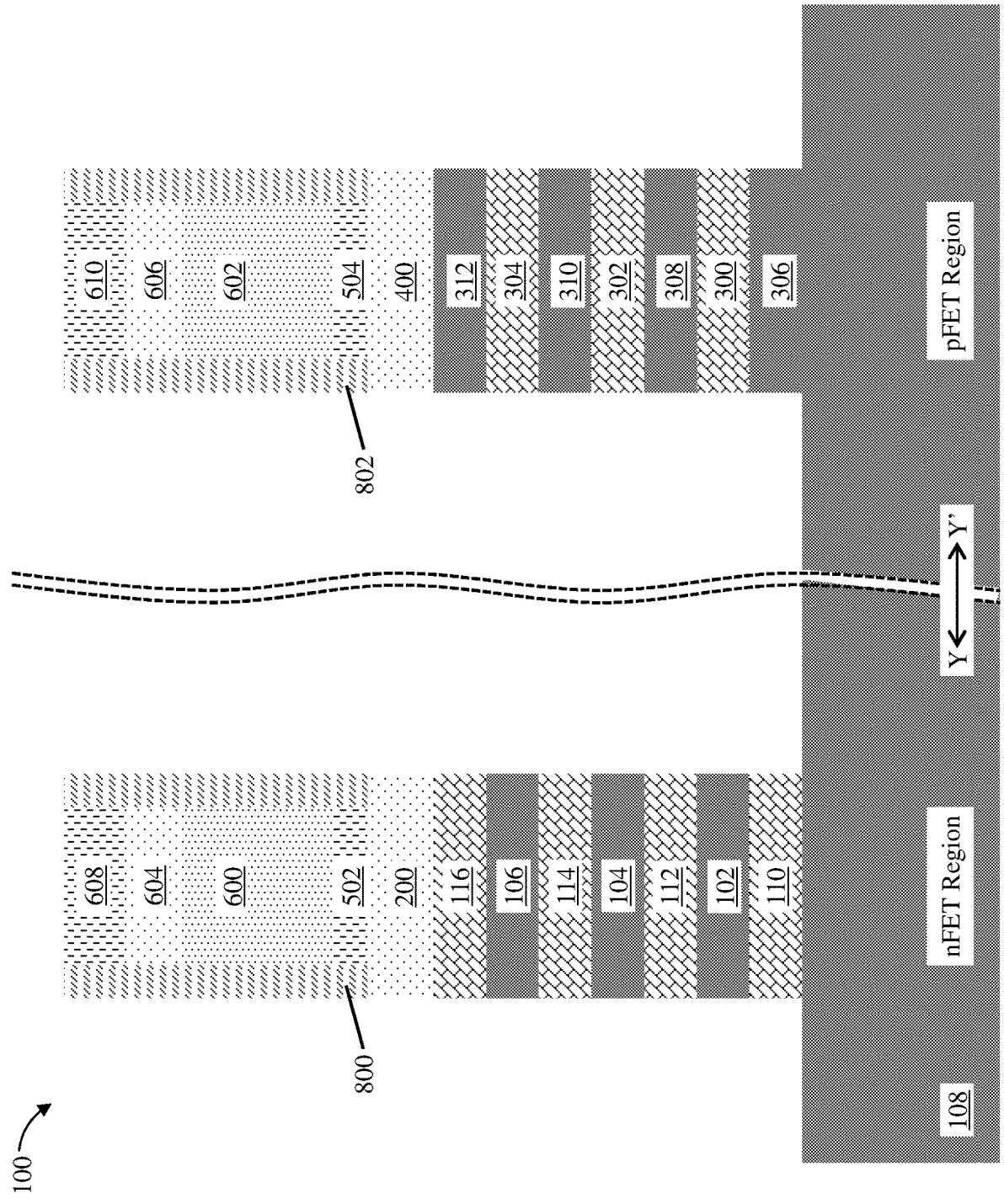

FIG. 8 illustrates a cross-sectional view of the structure 100 along the direction Y-Y' after forming spacers 800 and 802 (also known as sidewall spacers) on surfaces of the first and second sacrificial gates 600 and 602, respectively, during an intermediate operation of a method of fabricating a semiconductor device according to one or more embodiments. In some embodiments, the spacers 800 and 802 are formed using a CVD, PECVD, ALD, PVD, chemical solution deposition, or other like processes in combination with a wet or dry etch process. The spacers 800 and 802 can be any suitable material, such as, for example, a low-k dielectric, a nitride, silicon nitride, silicon dioxide, SiON, SiC, SiOCN, or SiBCN. Portions of the first nanosheet stack (i.e., nanosheets 102, 104, and 106) and the hard mask 200 are removed to expose a surface of the substrate 108. Portions of the second nanosheet stack (i.e., nanosheets 300, 302, and 304) and the hard mask 400 are similarly removed to expose a surface of the substrate 108. Any known method for patterning nanosheet stacks can be used, such as, for example, a wet etch, a dry etch, or a combination of sequential wet and/or dry etches. In some embodiments, a directional dry etch selective to the spacers 800 and 802 is used. In this manner, opposite ends of the first and second nanosheet stacks extend to opposite edges of the spacers 800 and 802, respectively.

Figure 9:
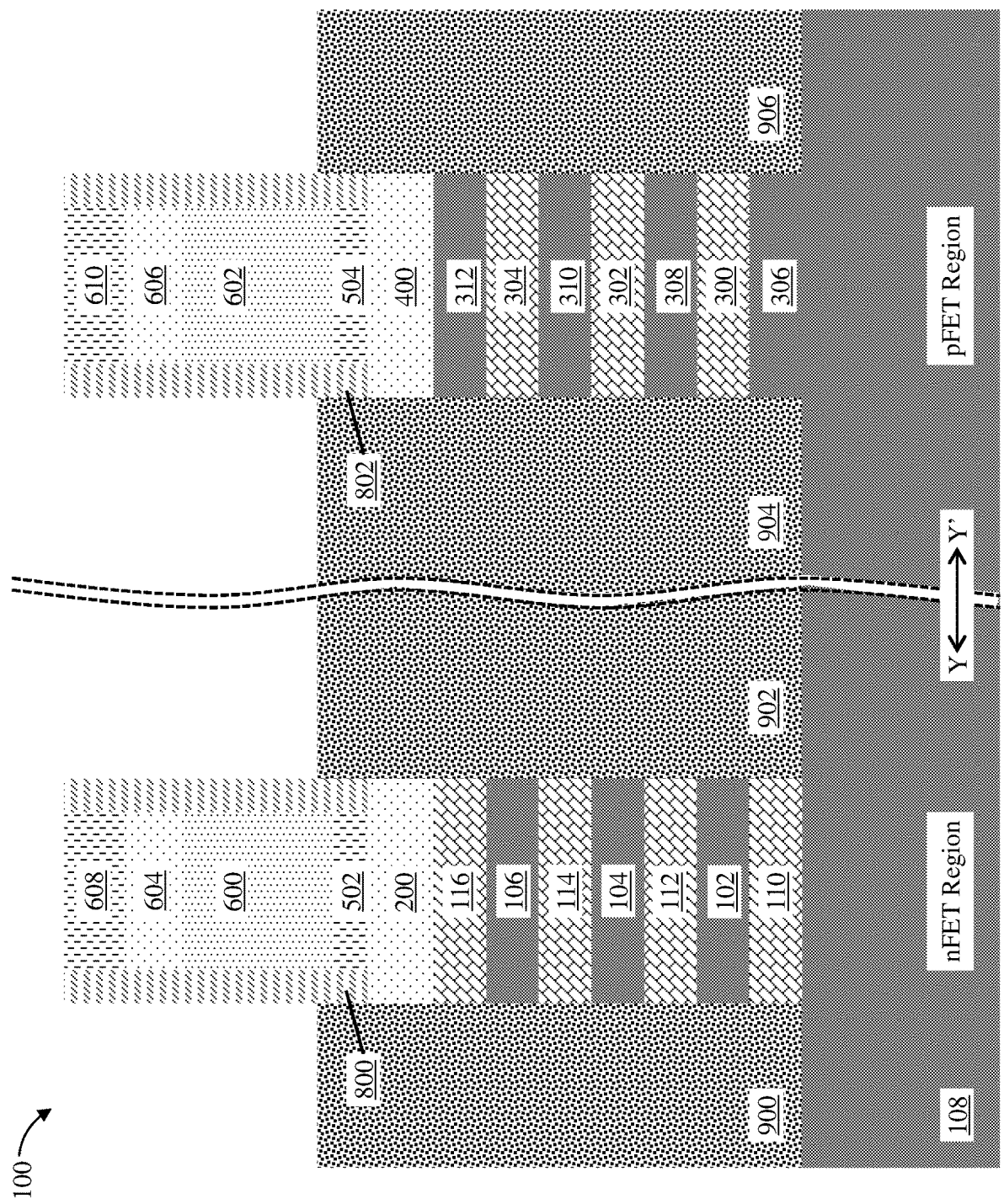

FIG. 9 illustrates a cross-sectional view of the structure 100 along the direction Y-Y' after forming doped regions 900, 902, 904, and 906 during an intermediate operation of a method of fabricating a semiconductor device according to one or more embodiments. The doped regions 900 and 902 are formed on opposite ends of the first nanosheet stack (e.g., nanosheets 102, 104, and 106) and the doped regions 904 and 906 are formed on opposite ends of the second nanosheet stack (e.g., nanosheets 300, 302, and 304). The doped regions 900, 902, 904, and 906 can be source or drain regions formed in the substrate 108 by a variety of methods, such as, for example, in-situ doped epitaxy, doped following the epitaxy, or by implantation and plasma doping. In some embodiments, the doped regions 900 and 902, and the doped regions 904 and 906 are complementary, such that one of the doped regions is a source while the other is a drain. In embodiments having both nFET and pFET regions the doped regions 900 and 902 are n-type doped regions and the doped regions 904 and 906 are p-type doped regions.

The doped regions 900, 902, 904, and 906 can be formed by any suitable process, including but not limited to, ultra-high vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), and MBE. In some embodiments, doped regions 900, 902, 904, and 906 include epitaxial semiconductor materials grown from gaseous or liquid precursors. In some embodiments, epitaxial regions are epitaxially grown from each exposed surface or sidewall of the nanosheets 102, 104, 106, 300, 302, and 304 until the epitaxial regions merge to form the doped regions 900, 902, 904, and 906. Epitaxial semiconductor materials can be grown using vapor-phase epitaxy (VPE), MBE, liquid-phase epitaxy (LPE), or other suitable processes. Epitaxial silicon, SiGe, and/or carbon doped silicon (Si:C) can be doped during deposition (in-situ doped) by adding dopants, n-type dopants (e.g., phosphorus or arsenic) or p-type dopants (e.g., boron or gallium). The dopant concentration in the doped regions 500, 502, 504, and 506 can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. An epitaxial silicon germanium alloy layer can be formed utilizing a combination of such gas sources. Carrier gases like hydrogen, nitrogen, helium and argon can be used. In some embodiments, the doped regions 500, 502, 504, and 506 include silicon. In some embodiments, the doped regions 500, 502, 504, and 506 include carbon doped silicon (Si:C). This Si:C layer can be grown in the same chamber used for other epitaxy steps or in a dedicated Si:C epitaxy chamber. The Si:C can include carbon in the range of 0.2 to 3.0%.

Figure 10:
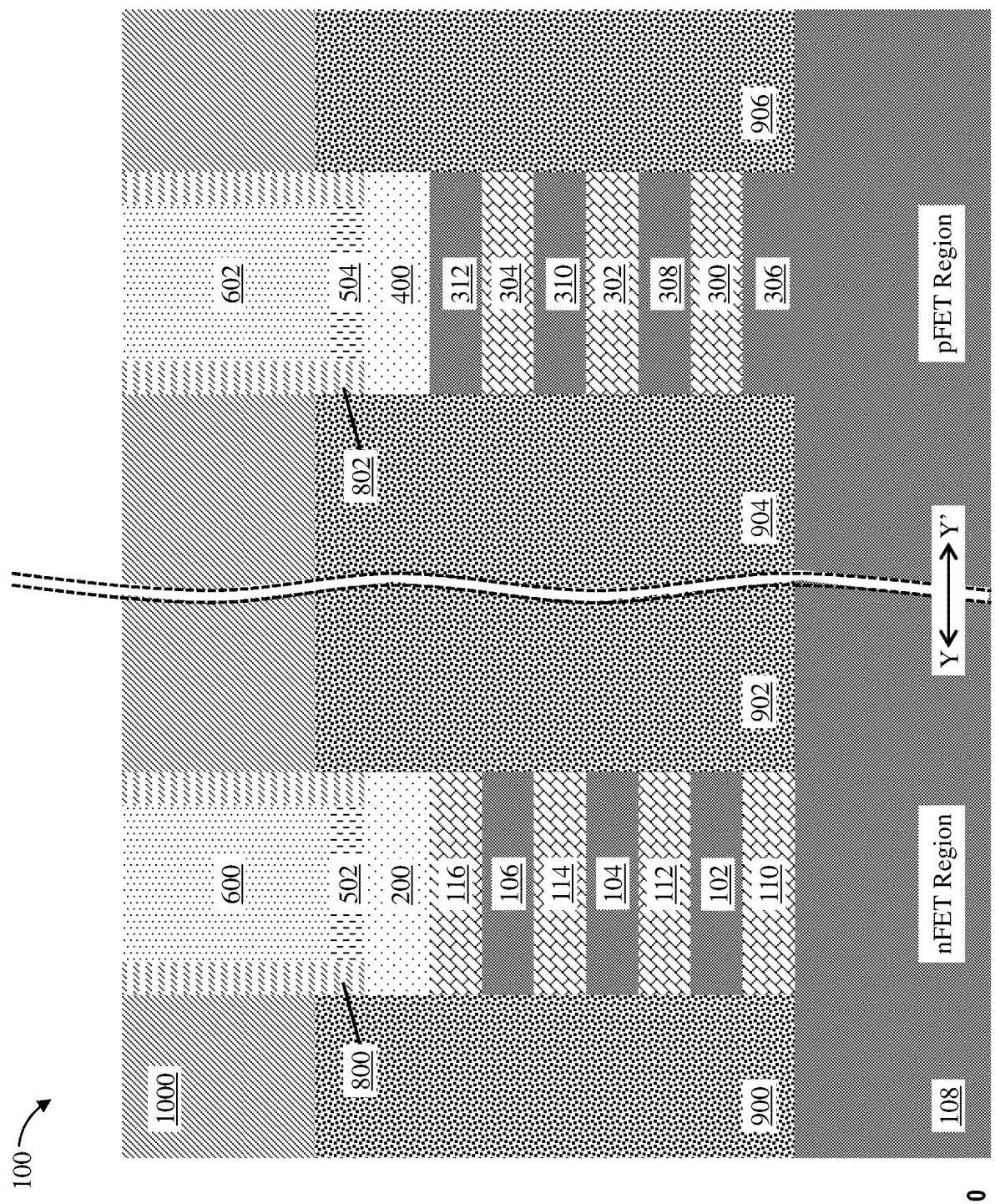

FIG. 10 illustrates a cross-sectional view of the structure 100 along the direction Y-Y' after opening the hard masks 604, 606, 608, and 610 to expose a surface of the first and second sacrificial gates 600 and 602 during an intermediate operation of a method of fabricating a semiconductor device according to one or more embodiments. An interlayer dielectric (ILD) 1000 is formed on the doped regions 900, 902, 904, and 906. The ILD 1000 can be any suitable material, such as, for example, porous silicates, carbon doped oxides, silicon dioxides, silicon nitrides, silicon oxynitrides, or other dielectric materials. Any known manner of forming the ILD 1000 can be utilized. The ILD 1000 can be formed using, for example, CVD, PECVD, ALD, flowable CVD, spin-on dielectrics, or PVD. In some embodiments, the ILD 1000 and the spacers 800 and 802 are planarized to a top surface of first and second sacrificial gates 600 and 602, using, for example, a CMP operation. In some embodiments, the ILD 1000 includes a thin nitride cap layer (not depicted).

Figure 11:
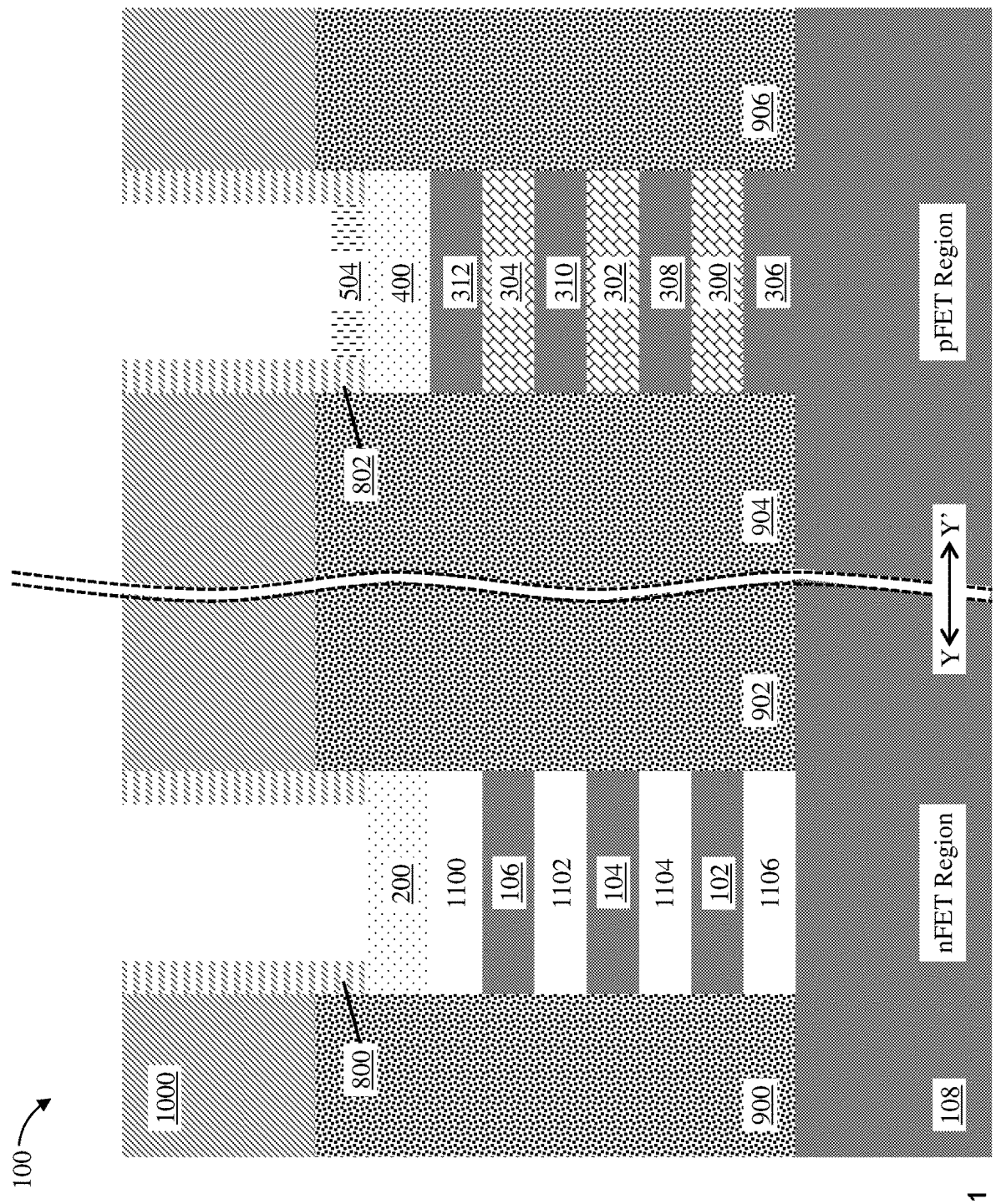
FIG. 11 depicts a cross-sectional view of the structure along the direction Y-Y' after removing the first and second sacrificial gates during an intermediate operation of a method of fabricating a semiconductor device according to one or more embodiments of the present invention.

FIG. 11 illustrates a cross-sectional view of the structure 100 along the direction Y-Y' after removing the first and second sacrificial gates 600 and 602 during an intermediate operation of a method of fabricating a semiconductor device according to one or more embodiments. In some embodiments, a hard mask (not depicted) is formed over the pFET Region and the oxide layer 502 is removed to expose the first nanosheet stack (e.g., nanosheets 102, 104, and 106) in the nFET Region. The sacrificial layers 110, 112, 114, and 116 are then removed to form a plurality of cavities 1100, 1102, 1104, and 1106. Any known removal process can be utilized. In some embodiments, the sacrificial layers 110, 112, 114, and 116 are removed using a wet or dry etch process selective to the nanosheets 102, 104, and 106. In some embodiments, an HCl etch is used to remove the sacrificial layers 110, 112, 114, and 116. In some embodiments, the HCl etch is a highly SiGe selective vapor phase etch at a temperature of about 300 to about 700 degrees Celsius.

Figure 12:
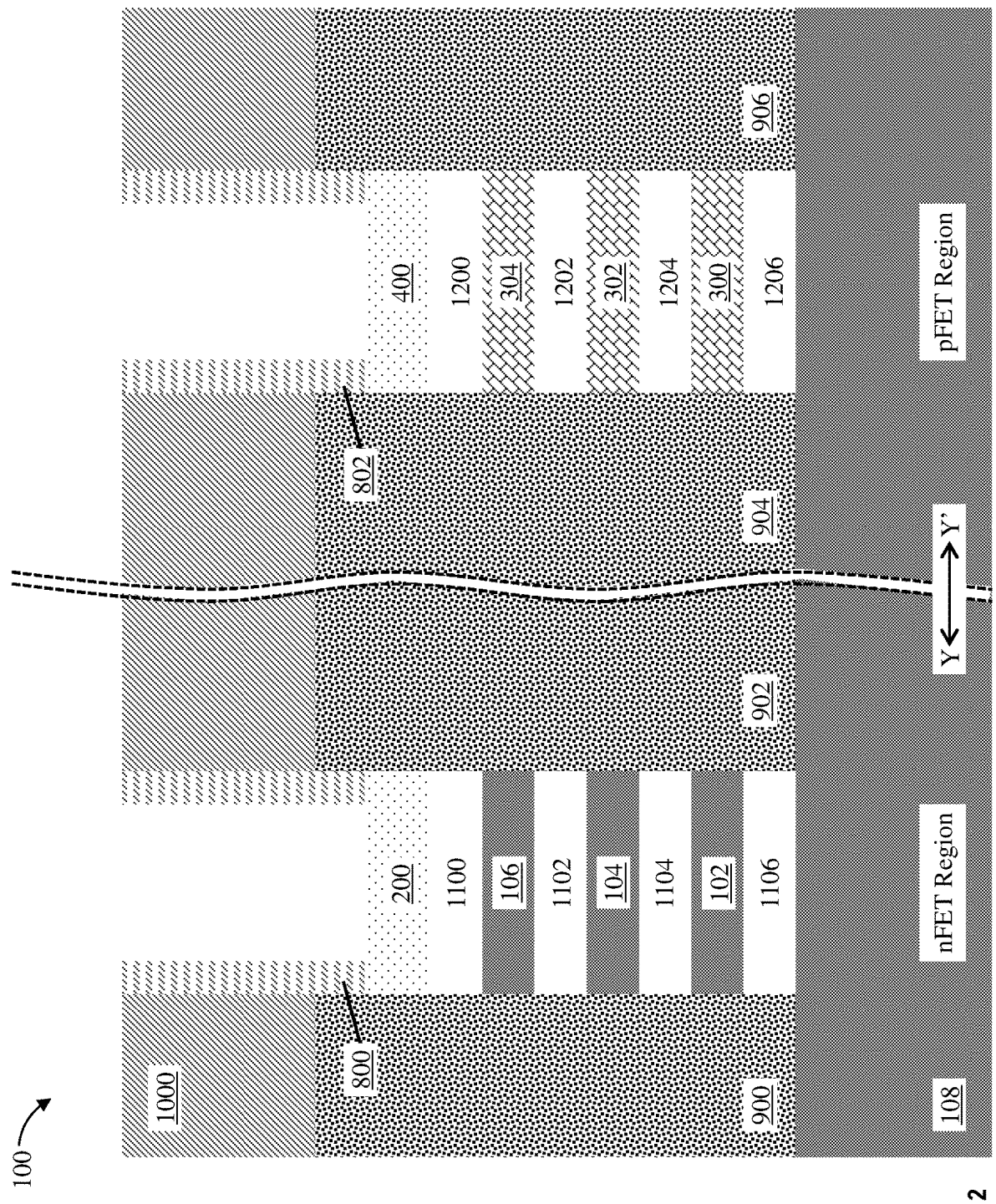
FIG. 12 depicts a cross-sectional view of the structure along the direction Y-Y' after removing the sacrificial layers during an intermediate operation of a method of fabricating a semiconductor device according to one or more embodiments of the present invention.

FIG. 12 illustrates a cross-sectional view of the structure 100 along the direction Y-Y' after removing the sacrificial layers 306, 308, 310, and 312 during an intermediate operation of a method of fabricating a semiconductor device according to one or more embodiments. In some embodiments, a hard mask (not depicted) is formed over the nFET Region and the oxide layer 504 is removed to expose the second nanosheet stack (e.g., nanosheets 300, 302, and 304) in the pFET Region. The sacrificial layers 306, 308, 310, and 312 are then removed to form a plurality of cavities 1200, 1202, 1204, and 1206. Any known removal process can be utilized. In some embodiments, the sacrificial layers 306, 308, 310, and 312 are removed using a wet or dry etch process selective to the nanosheets 300, 302, and 304. In some embodiments, the etch includes a highly Si selective wet etchant. In some embodiments, tetramethylammnoium hydroxide (TMAH), tetraethylammnoium hydroxide (TEAH), or ammonium hydroxide (NH$_4$OH) can be used to remove the sacrificial layers 306, 308, 310, and 312.

FIG. 13 illustrates a cross-sectional view of the structure 100 along the direction Y-Y' after forming conductive gates 1300 and 1302 to wrap around channel portions of the first and second nanosheet stacks, respectively, during an intermediate operation of a method of fabricating a semiconductor device according to one or more embodiments. Portions 1308 and 1310 (also known as topmost work function layers) of the conductive gates 1300 and 1302 fill the cavities 1100 and 1200 to replace the removed sacrificial layers 116 and 312, respectively. For ease of discussion only work function layers 1308 and 1310 are provided with separate reference numbers. It is understood, however, that work function layers are formed in each of the cavities to replace all of the removed sacrificial layers. The hard mask 200 ensures that the topmost work function layer 1308 has the same thickness as the other work function layers in the first nanosheet stack. Similarly, the hard mask 400 ensures that the topmost work function layer 1310 has the same thickness as the other work function layers in the second nanosheet stack.

The conductive gates 1300 and 1302 and work function layers 1308 and 1310 can be made of work function materials, such as, for example, aluminum, lanthanum oxide, magnesium oxide, strontium titanate, strontium oxide, titanium nitride, titanium aluminum nitride, titanium aluminum carbide, tantalum nitride, and combinations thereof. In some embodiments, the conductive gates 1300 and 1302 include a conductive metal, such as, for example, tungsten.

In some embodiments, the conductive gate 1300 includes a high-k dielectric region 1304 and the conductive gate 1302 includes a high-k dielectric region 1306. In some embodiments, the high-k dielectric regions 1304 and 1306 further modify the work function of each respective gate. The high-k dielectric regions 1304 and 1306 can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments, the high-k dielectric regions 1304 and 1306 can have a thickness of about 0.5 nm to about 4 nm. In some embodiments, the high-k dielectric regions 1304 and 1306 can have a thickness of about 2 nm to about 3 nm, although other thicknesses are within the contemplated scope of the invention.

FIG. 14 illustrates a cross-sectional view of the structure 100 along the direction Y-Y' after replacing the hard masks 200 and 400 with conductive layers 1400 and 1402 during an intermediate operation of a method of fabricating a semiconductor device according to one or more embodiment. In this manner, the hard masks 200 and 400 are removed only after forming the conductive gates 1300 and 1302. In some embodiments, the hard masks 200 and 400 are first removed to form cavities (not depicted) and the conductive layers 1400 and 1402 are formed to fill the cavities. The conductive layers 1400 and 1402 can be of any suitable material, such as, for example, tungsten or cobalt.

In some embodiments, the ILD 1000 is expanded above a surface of the conductive gates 1300 and 1302 and a metallization operation forms a first nFET contact 1404 contacting a surface of the doped region 900, a second nFET contact 1406 contacting a surface of the doped region 902, and an nFET gate contact 1408 contacting a surface of the conductive gate 1300. In some embodiments, a first pFET contact 1410 contacting a surface of the doped region 904, a second pFET contact 1412 contacting a surface of the doped region 906, and a pFET gate contact 1414 contacting a surface of the conductive gate 1302 are formed in a similar manner. Any known manner of forming or depositing the contacts 1404, 1406, 1408, 1410, 1412, and 1414 can be utilized. In some embodiments, the ILD 1000 is extended with additional material, patterned with open trenches, and the contacts 1404, 1406, 1408, 1410, 1412, and 1414 are deposited into the trenches. In some embodiments, the contacts 1404, 1406, 1408, 1410, 1412, and 1414 are overfilled into the trenches, forming overburdens above a surface of the ILD 1000. In some embodiments, a CMP selective to the ILD 1000 removes the overburden.

The contacts 1404, 1406, 1408, 1410, 1412, and 1414 can be of any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the contacts 1404, 1406, 1408, 1410, 1412, and 1414 can be copper and can include a barrier metal liner. The barrier metal liner prevents the copper from diffusing into, or doping, the surrounding materials, which can degrade their properties. Silicon, for example, forms deep-level traps when doped with copper. An ideal barrier metal liner must limit copper diffusivity sufficiently to chemically isolate the copper conductor from the surrounding materials and should have a high electrical conductivity, for example, tantalum nitride and tantalum (TaN/Ta), titanium, titanium nitride, cobalt, ruthenium, and manganese.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments described herein.

What is claimed is:

1. A semiconductor device comprising:
   a nanosheet stack formed over a substrate, the nanosheet stack comprising a first nanosheet vertically stacked between a top work function layer and a bottom work function layer;
   a gate formed over a channel region of the nanosheet stack; and
   a conductive layer formed between the gate and the top work function layer;
   wherein a thickness of the top work function layer is substantially equal to a thickness of the bottom work function layer.

2. The semiconductor device of claim 1, wherein the conductive layer comprises tungsten or cobalt.

3. The semiconductor device of claim 1, wherein the conductive layer comprises a thickness of about 10 nm.

4. The semiconductor device of claim 1, wherein the nanosheet stack further comprises a plurality of nanosheets alternating with a plurality of sacrificial layers.

5. The semiconductor of claim 4, wherein each pair of adjacent nanosheets is separated by a sacrificial layer.

6. The semiconductor of claim 5, wherein a thickness of each sacrificial layer is substantially equal.

7. The semiconductor device of claim 4, wherein each nanosheet of the nanosheet stack has a thickness of about 4 nm to about 10 nm.

8. The semiconductor device of claim 1, wherein the thickness of the top and bottom work function layers is about 10 nm.

9. The semiconductor device of claim 1, wherein the thickness of the top and bottom work function layers is about 6 nm.

10. The semiconductor device of claim 1, wherein the top and bottom work function layers comprise a material selected from the group comprising aluminum, lanthanum oxide, magnesium oxide, strontium titanate, strontium oxide, titanium nitride, titanium aluminum nitride, titanium aluminum carbide, tantalum nitride.

11. A semiconductor device comprising:
    a nanosheet stack formed over a substrate, the nanosheet stack comprising an alternating stack of a plurality of nanosheets and a plurality of work function layers;
    a gate formed over a channel region of the nanosheet stack; and
    a conductive layer formed between the gate and a top work function layer included in the nanosheet stack;
    wherein the top work function layer has an equal thickness with respect to each remaining work function layer included in the nanosheet stack.

12. The semiconductor device of claim 11, wherein the conductive layer comprises tungsten or cobalt.

13. The semiconductor device of claim 11, wherein the conductive layer comprises a thickness of about 10 nm.

14. The semiconductor device of claim 11, wherein the nanosheet stack further comprises a plurality of nanosheets alternating with a plurality of sacrificial layers.

15. The semiconductor of claim 14, wherein each pair of adjacent nanosheets is separated by a sacrificial layer.

16. The semiconductor of claim 15, wherein a thickness of each sacrificial layer is substantially equal.

17. The semiconductor device of claim 14, wherein each nanosheet of the nanosheet stack has a thickness of about 4 nm to about 10 nm.

18. The semiconductor device of claim 11, wherein the thickness of the top and bottom work function layers is about 10 nm.

19. The semiconductor device of claim 11, wherein the thickness of the top and bottom work function layers is about 6 nm.

20. The semiconductor device of claim 11, wherein the top and bottom work function layers comprise a material selected from the group comprising aluminum, lanthanum oxide, magnesium oxide, strontium titanate, strontium oxide, titanium nitride, titanium aluminum nitride, titanium aluminum carbide, tantalum nitride.

* * * * *